(12) United States Patent
Pfeuffer et al.

(10) Patent No.: US 9,891,303 B2
(45) Date of Patent: *Feb. 13, 2018

(54) MAGNETIC RESONANCE SYSTEM AND METHOD TO CONTINUOUSLY CORRECT PHASE ERRORS IN A MULTIDIMENSIONAL, SPATIALLY SELECTIVE RADIOFREQUENCY EXCITATION PULSE IN A MAGNETIC RESONANCE MEASUREMENT SEQUENCE

(71) Applicant: Siemens Aktiengesellschaft, Munich (DE)

(72) Inventors: Josef Pfeuffer, Kunreuth (DE); Thorsten Speckner, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 1231 days.

This patent is subject to a terminal disclaimer.

(21) Appl. No.: 13/898,667

(22) Filed: May 21, 2013

(65) Prior Publication Data
US 2013/0307538 A1 Nov. 21, 2013

(30) Foreign Application Priority Data
May 21, 2012 (DE) .................. 10 2012 208 431

(51) Int. Cl.
*G01R 33/58* (2006.01)
*G01R 33/483* (2006.01)
*G01R 33/565* (2006.01)

(52) U.S. Cl.
CPC ....... *G01R 33/583* (2013.01); *G01R 33/4836* (2013.01); *G01R 33/5659* (2013.01); *G01R 33/56509* (2013.01); *G01R 33/56572* (2013.01)

(58) Field of Classification Search
USPC .................. 324/300–322; 600/407–435; 382/128–131
See application file for complete search history.

(56) References Cited

U.S. PATENT DOCUMENTS

| 4,857,844 A | 8/1989 | Van Vaals |
| 5,581,184 A | 12/1996 | Heid |

(Continued)

FOREIGN PATENT DOCUMENTS

JP 2006061235 A 3/2006

OTHER PUBLICATIONS

Schneider et al., "Robust Spatially Selective Excitation Using Radiofrequency Pulses Adapted to the Effective Spatially Encoding Magnetic Fields", Magnetic Resonance in Medicine, vol. 65 pp. 409-421 (2011).

(Continued)

*Primary Examiner* — Melissa Koval
*Assistant Examiner* — Tiffany Fetzner
(74) *Attorney, Agent, or Firm* — Schiff Hardin LLP

(57) ABSTRACT

In a method and magnetic resonance system to correct phase errors in multidimensional, spatially selective radio-frequency excitation pulses in a pulse sequence used to operate the system to acquire magnetic resonance data, a multidimensional, spatially selective radio-frequency excitation pulse is radiated and multiple calibration gradient echoes are acquired. A phase correction and a time correction of the multidimensional, spatially selective radio-frequency excitation pulse is then calculated.

13 Claims, 12 Drawing Sheets

(56) References Cited

U.S. PATENT DOCUMENTS

| | | | |
|---|---|---|---|
| 6,469,505 B1* | 10/2002 | Maier | G01R 33/56518 324/307 |
| 7,327,141 B2 | 2/2008 | Jung et al. | |
| 7,944,206 B2* | 5/2011 | Frydman | G01R 33/4822 324/307 |
| 8,228,062 B2* | 7/2012 | Sharp | G01R 33/3415 324/309 |
| 2001/0017544 A1 | 8/2001 | Miyamoto | |
| 2002/0167319 A1 | 11/2002 | Ikezaki | |
| 2004/0039276 A1 | 2/2004 | Ikezaki | |
| 2007/0222446 A1 | 9/2007 | Jung et al. | |
| 2008/0036458 A1 | 2/2008 | Tatebayashi et al. | |
| 2009/0201021 A1 | 8/2009 | Jellus | |
| 2010/0001727 A1* | 1/2010 | Frydman | G01R 33/4822 324/310 |
| 2010/0171499 A1* | 7/2010 | Sharp | G01R 33/3415 324/318 |
| 2011/0254548 A1 | 10/2011 | Setsompop et al. | |
| 2011/0291653 A1 | 12/2011 | Umeda | |
| 2013/0057281 A1 | 3/2013 | Feiweier | |
| 2013/0307538 A1* | 11/2013 | Pfeuffer | G01R 33/583 324/314 |
| 2013/0307539 A1* | 11/2013 | Pfeuffer | G01R 33/583 324/314 |

OTHER PUBLICATIONS

Oelhafen et.al. "Calibration of Echo-Planar 2D-Selective RF Excitation Pulses", Magnetic Resonance in Medicine, vol. 52: pp. 1136-1145 (2004).

Rieseberg et al. "Two_Dimensional Spatially-Selective RF Excitation Pulses in Echo-Planar Imaging," Magnetic Resonance in Medicine, vol. 47, pp. 1186-1193 (2002).

* cited by examiner

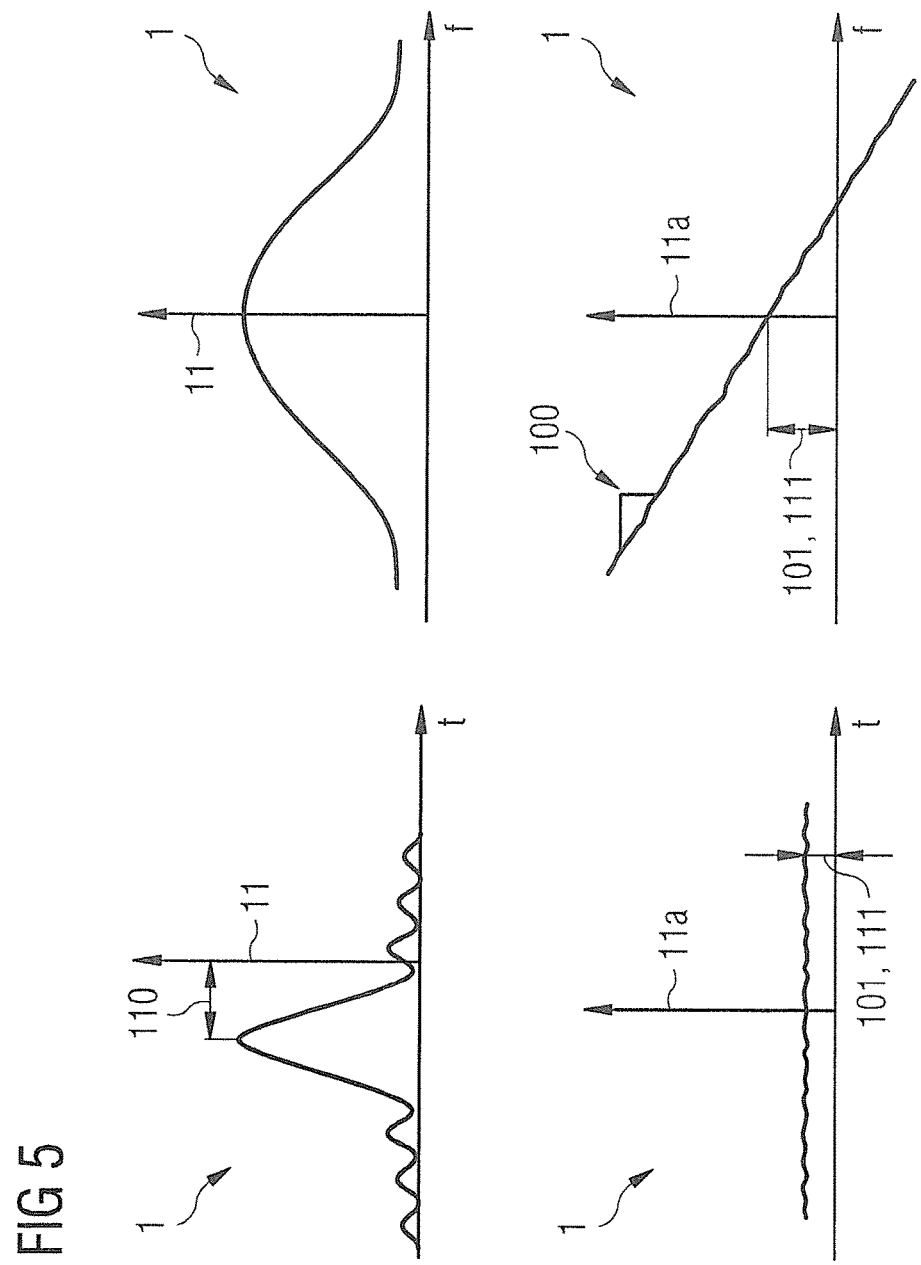

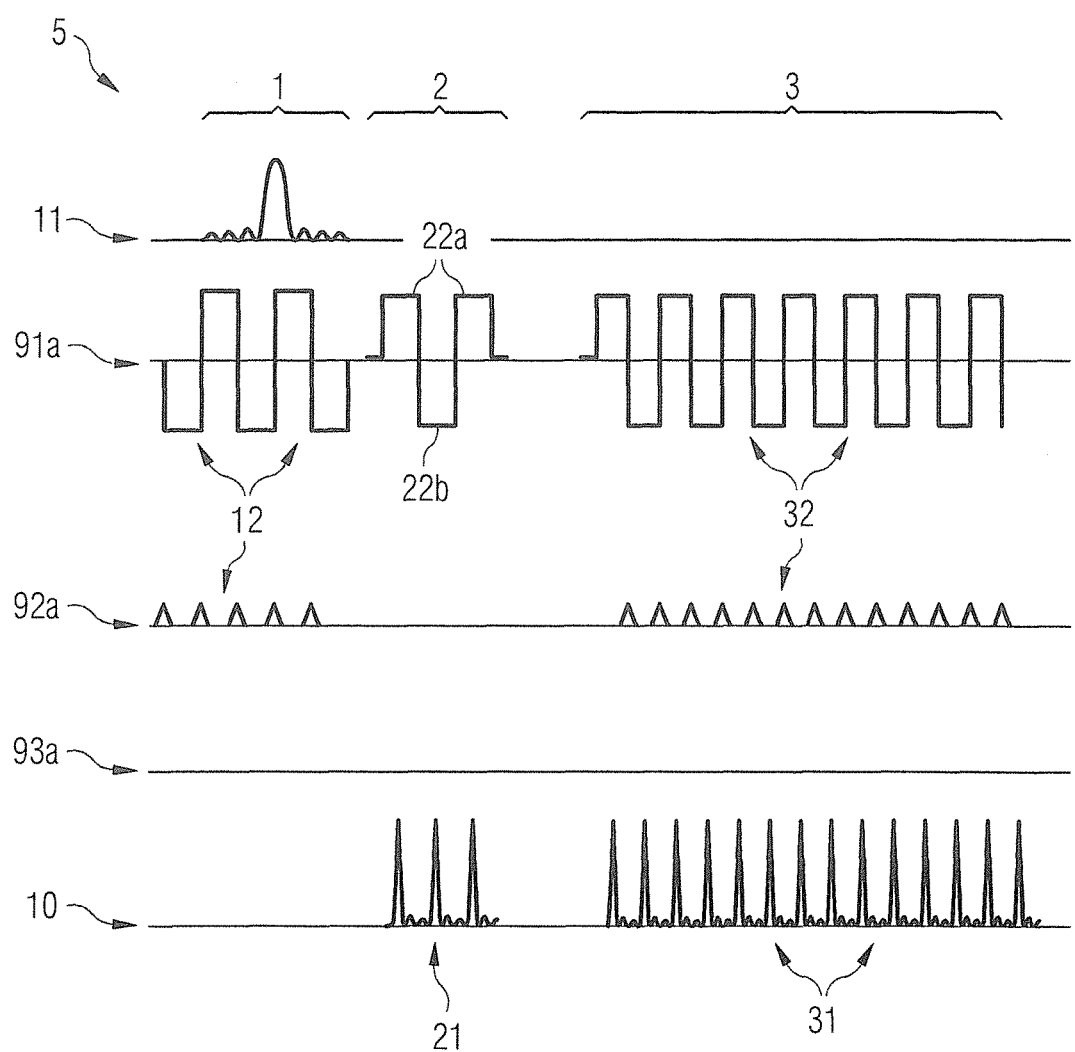

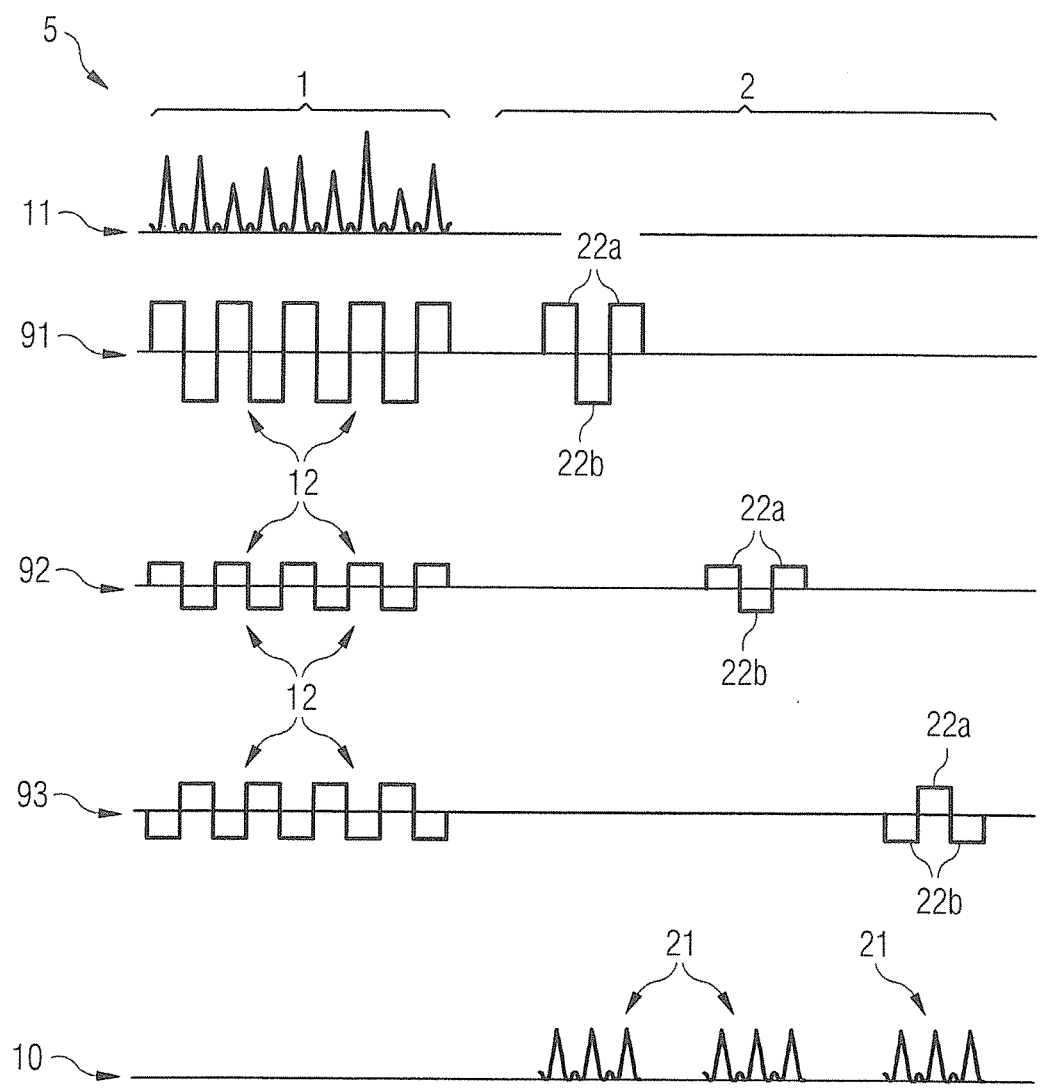

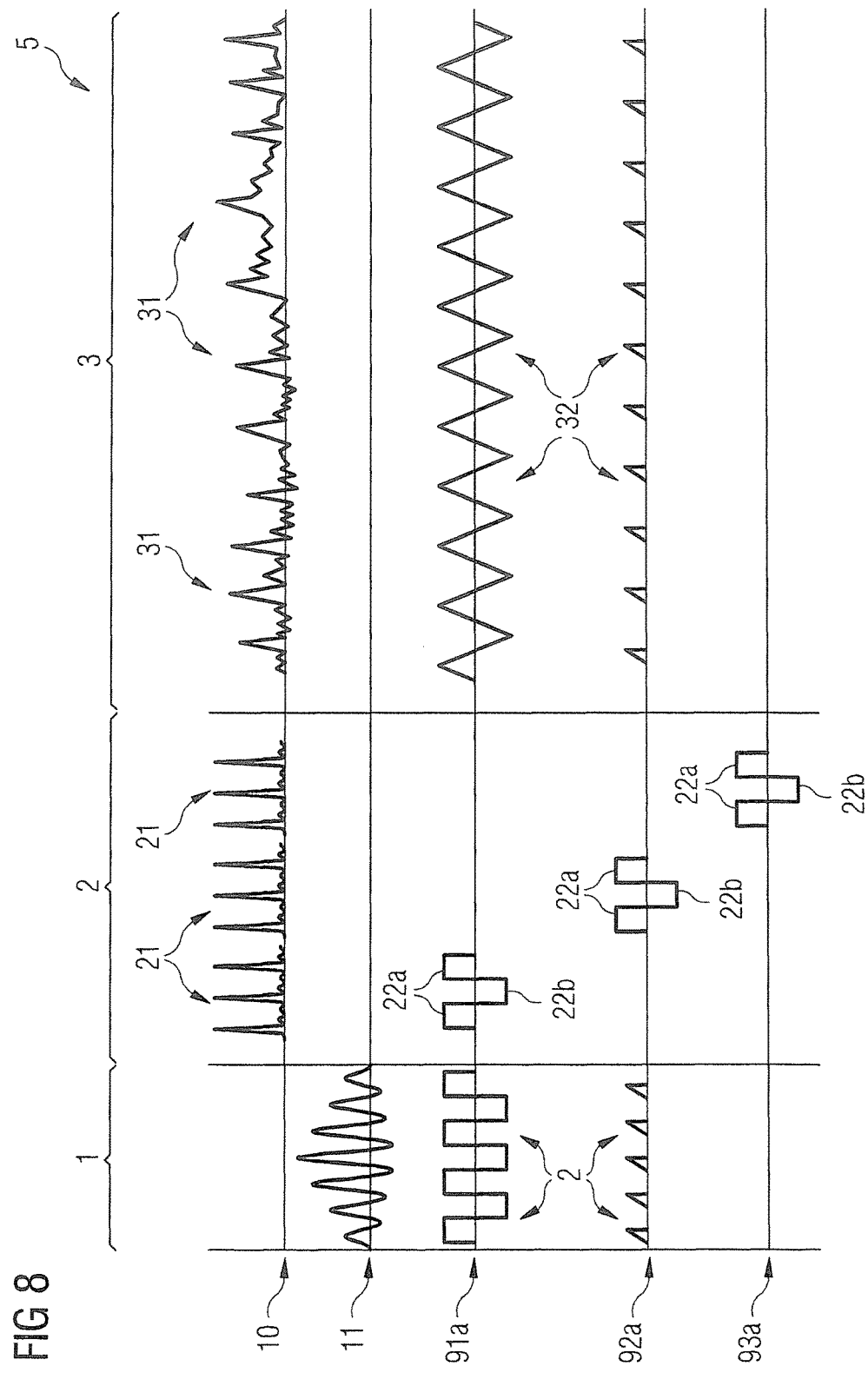

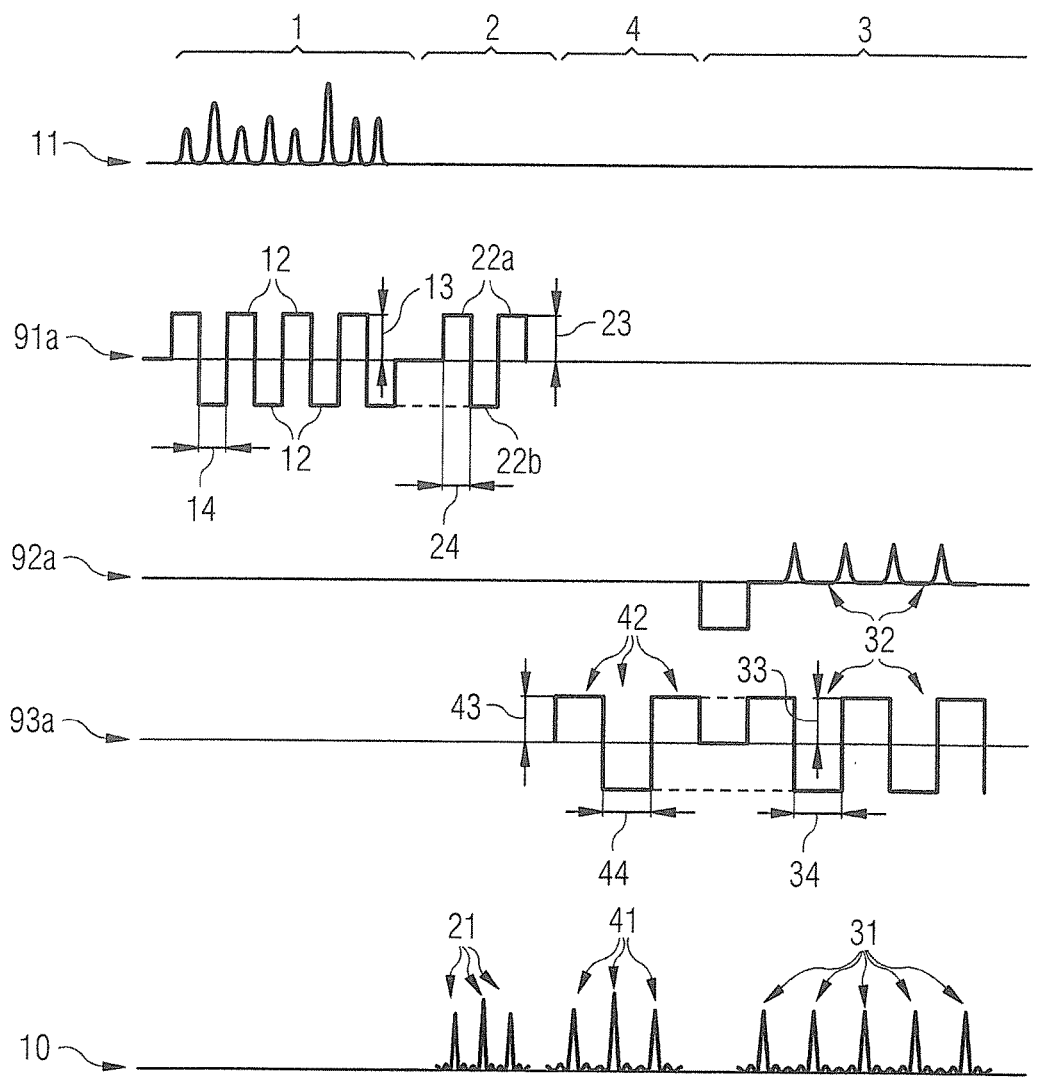

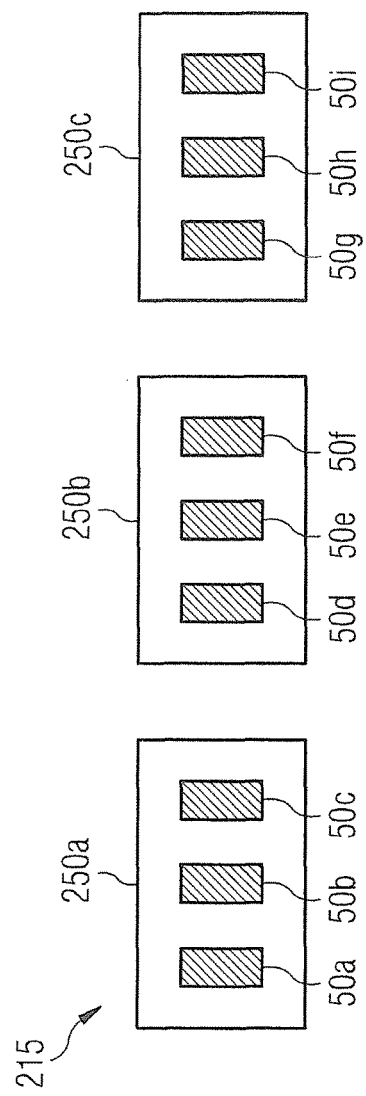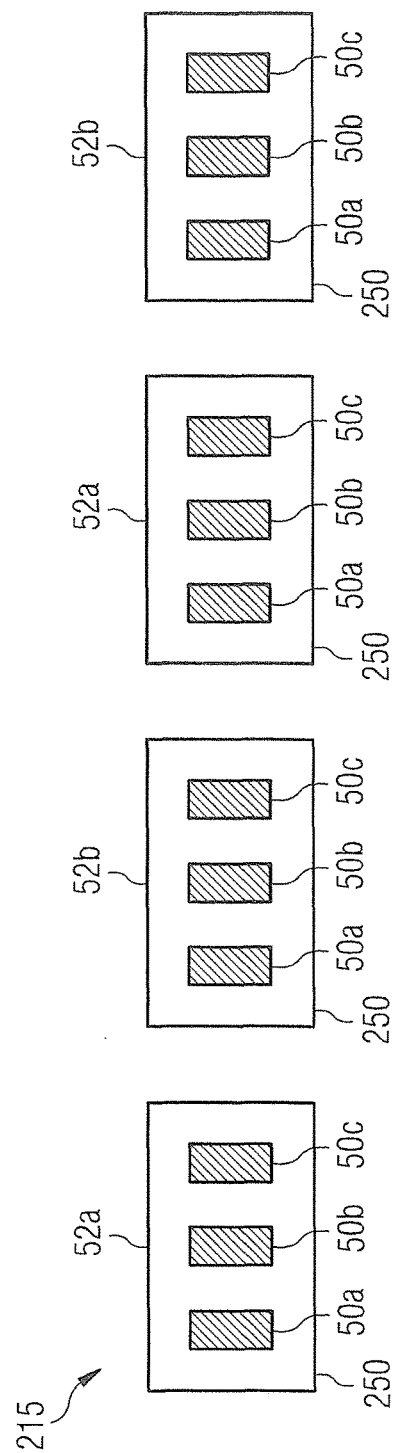

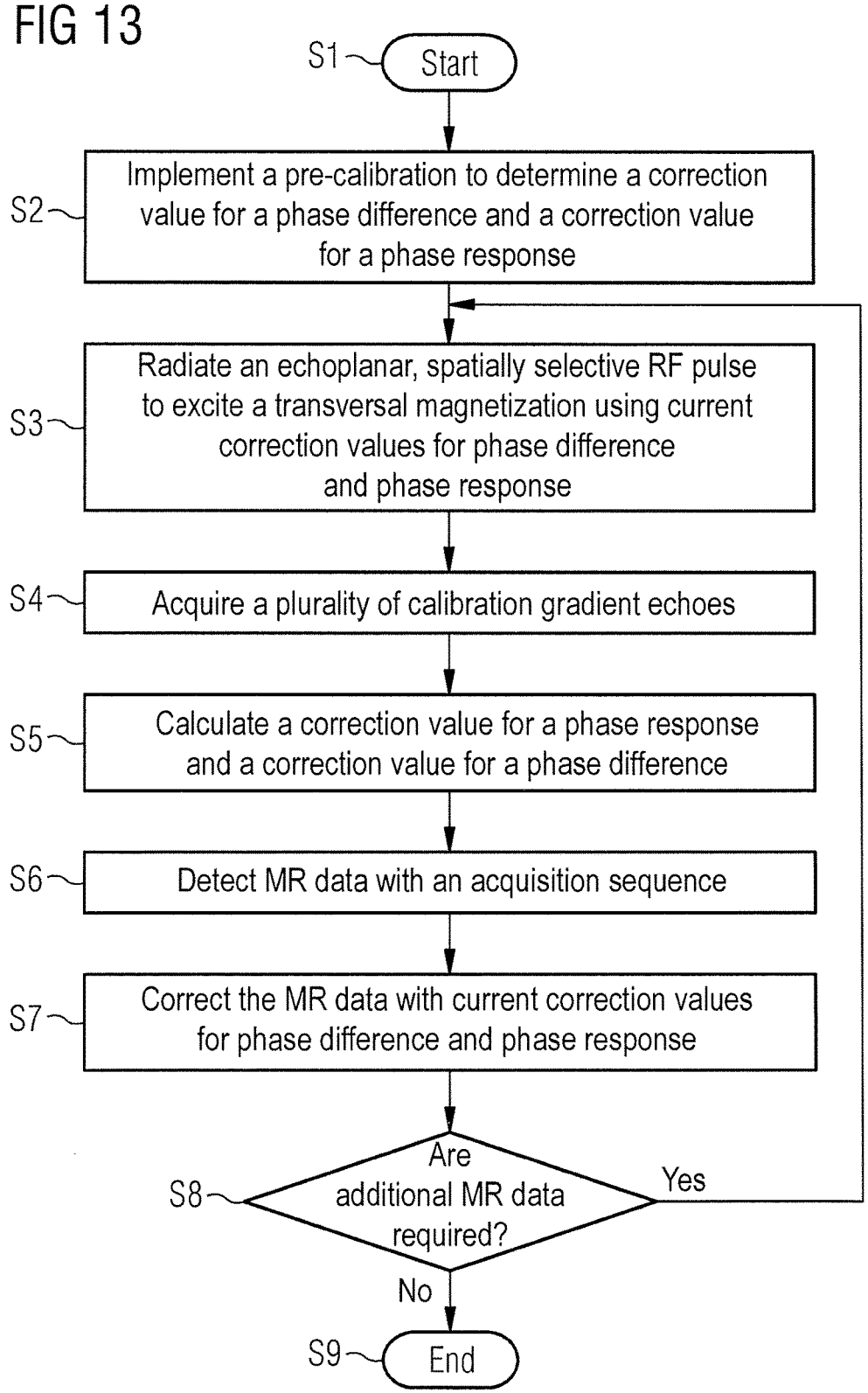

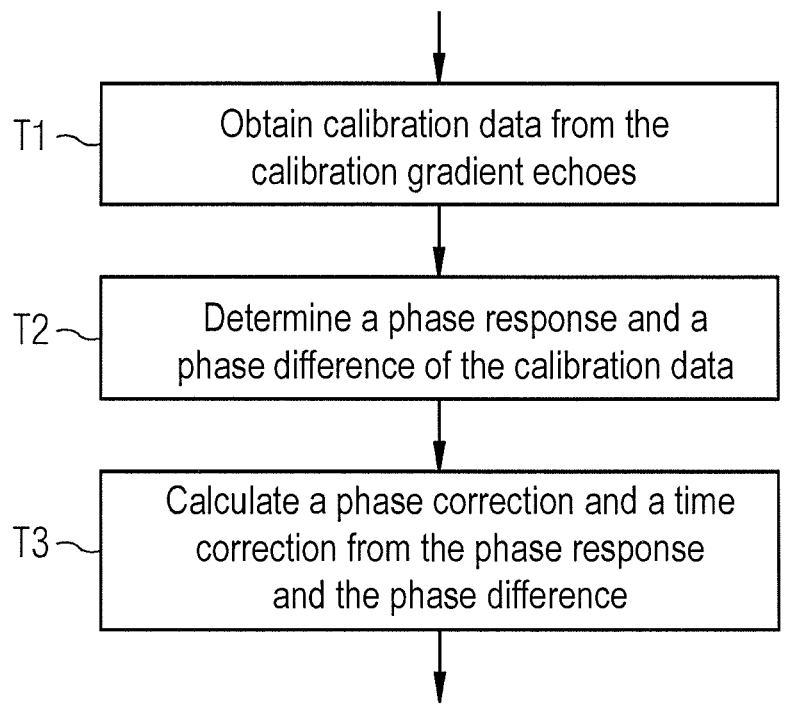

MAGNETIC RESONANCE SYSTEM AND METHOD TO CONTINUOUSLY CORRECT PHASE ERRORS IN A MULTIDIMENSIONAL, SPATIALLY SELECTIVE RADIOFREQUENCY EXCITATION PULSE IN A MAGNETIC RESONANCE MEASUREMENT SEQUENCE

BACKGROUND OF THE INVENTION

Field of the Invention

The present invention concern a magnetic resonance system and method to correct phase errors in multidimensional, spatially selective radio-frequency excitation pulses, used in a magnetic resonance data acquisition sequence that operates a magnetic resonance data acquisition unit.

Description of the Prior Art

Magnetic resonance (MR) tomography is an imaging method that enables the acquisition of two-dimensional or three-dimensional image data sets that can depict structures inside an examination subject with high resolution. In MR, the magnetic moments of protons in an examination subject are aligned in a basic magnetic field or primary magnetic field (B0) so that a macroscopic magnetization appears along a longitudinal direction. This alignment is subsequently deflected out of the steady state, parallel to the basic magnetic field, by the radiation of radio-frequency (RF) pulses (excitation, TX). A transverse magnetization is thereby generated. Special RF transmission coils of an MR system are typically used for the RF radiation.

The decay of the transverse magnetization back into the steady state (the magnetization dynamic) is subsequently detected as MR data by one or more RF reception coils of the MR system (imaging, RX). A spatial coding of the acquired MR data is achieved by the application of different magnetic field gradients (for slice selection, phase coding or frequency coding). A targeted dephasing/rephasing of the transverse magnetization to achieve what is known as a gradient axis can occur by the application of gradient fields. The gradient fields can be applied along axes (gradient axes) of an apparatus coordinate system of the MR system via coils provided for this purpose. The different gradient axes can be controlled via separate channels. It is also possible to achieve a rephasing of the transverse magnetization (known as the spin echo) by the radiation of an RF pulse. The detected (and therefore spatially resolved) MR data initially exist in a mathematical arrangement in the frequency domain, known as k-space, and can be transformed into the spatial domain, known as image space by subsequent Fourier transformation. K-space can be scanned (filled with data) along different trajectories by the targeted switching (activation) of the magnetic field gradients. A conventional and widely used scan includes the successive detection of frequency-coded k-space lines for different phase codings. A corresponding coordinate system aligned to the spatial coding is designated as a phase-gradient-slice (PGS) coordinate system. In particular, the PGS coordinate system can be aligned on a patient coordinate system that determines the anatomical planes (for example transversal, sagittal and coronal planes) of the examination subject.

Recently, RF excitation pulses have been developed in an attempt to shorten the measurement time, for instance for multidimensional, selective excitation. Such RF excitation pulses use special k-space trajectories to excite the transverse magnetization. Regions that are clearly spatially defined (and bounded, for example) in two dimensions (2D) or three dimensions (3D) can thereby be excited. For example, gradient fields along multiple axes are used for this purpose. It is also possible to provide a special amplitude modulation of the RF excitation pulse.

This can in turn allow the number of sample points to be limited, and thereby reduce the time required to implement a complete measurement sequence. Examples of such pulses are known, for instance, from "Two-Dimensional Spatially-Selective RF Excitation Pulses in Echo-Planar Imaging" by S. Riesenberg et al. in Mag. Reson. Med. 47 (2002), 1186-1193. Such RF excitation pulses are known as echoplanar, spatially-selective RF excitation pulses, or can use spiral-shaped trajectories.

However, due to the greater complexity in comparison to conventional one-dimensional (1D) RF excitation pulses—for example with a constant gradient field, thus slice-selective excitation—a greater tendency toward artifact formation given system inaccuracies can occur in multidimensional, spatially-selective RF excitation pulses. In particular, phase errors can occur, i.e. incorrect phases during the RF excitation pulse.

One class of system inaccuracies relates to systematic error sources that are inherent to the system and typically exist systematically, and have no or only a slight time dependency, such as time synchronization errors of the MR systems produce artifacts and errors in the execution of the k-space trajectories during the excitation. These errors steam from systematic time shifts between the amplitude or phase of the RF excitation pulse and the gradient fields and/or between the amplitude or phase of the RF excitation pulse and the radio-frequency, for instance of a numerically controlled oscillator. Additional sources of artifacts can be gradient delay between the different gradient axes, incorrect amplitudes of the gradients, a channel-specific and/or global delay of the radio-frequency of the RF excitation pulses and the gradient fields. Such artifacts are known as "TX ghosting" or "phase mismatch"; see in this regard "Calibration of Echo-Planar 2D-Selective RF Excitation Pulses" by M. Oelhafen et al. in Mag. Reson. Med. 52 (2004), 1136-1145, and "Robust Spatially Selective Excitation Using Radiofrequency Pulses Adapted to the Effective Spatially Encoding Magnetic Fields" by J. T. Schneider et al. in Mag. Reson. Med 65 (2011), 409-421.

An additional class of system inaccuracies concerns time-variable error sources, such as component heating and system parameter drift in general, and component instabilities. The examination subject can be a source of time-dependent error sources, for example due to an overall (gross) movement of the examination subject, organ movement, or physiological variations such as heart beat, breathing or brain movement. For example, an organ movement can produce a shift of the regions of different susceptibilities, which in turn results in time-dependent, B0-dependent artifacts. Moreover, eddy currents that develop during the application of the RF excitation pulse can affect the phases and k-space trajectory, which can produce artifacts.

The aforementioned time-dependent error sources have a particular importance to MR measurement sequences with repeated imaging, thus for instance "multislice EPI". A transverse magnetization is repeatedly excited multiple times, for example in order to image different slices or regions. However, such MR measurement sequences can also include different repeated preparation of the transverse magnetization, such as diffusion coding, spin labeling or the use of contrast agents for functional MR (fMR), perfusion or diffusion imaging. Such measurement sequences extend over a time period of minutes.

In this regard, in many cases it is not possible (or is possible only to a limited extent) to ensure a high stability of the system parameters or the parameters of the measurement system, such that even a comprehensive, individual calibration to correct phase errors at the beginning of the measurement sequence (as is known from the aforementioned publications by J. T. Schneider et al. and M. Oelhafen et al.) can have only a limited period of validity. Moreover, these known calibration techniques have additional disadvantages: a relatively long time period is often required for the implementation of the calibration, such that the time period of the entire measurement sequence is undesirably increased. It can also be necessary to implement these calibration techniques as separate sequences (for example before the actual measurement sequence), which can make a particularly complicated implementation necessary with regard to the operation of the MR system.

Many techniques were described above with regard to the excitation of the transverse magnetization. It should also be noted that similar problems and system inaccuracies can occur with regard to the imaging: complicated k-space trajectories can be used not only during the excitation but also for the imaging. There corresponding problems and artifacts can occur, which determine a time synchronization of the amplitude and phase of the RF excitation pulse and the gradient fields, as well as the amplitude and phase of the RF excitation pulse and the radio-frequency of the RF excitation pulse. Examples of such imaging are, for example, echoplanar imaging (EPI) and variants thereof that are known to those skilled in the art under the following terms: "blipped EPI", "spiral EPI" or radial EPI acquisition sequences.

SUMMARY OF THE INVENTION

An object of the invention is to provide improved techniques for calibration in the use of MR measurement sequences with multidimensional, spatially-selective RF excitation pulses.

One aspect of the invention concerns a method to correct phase errors in multidimensional, spatially-selective RF excitation pulses of a magnetic resonance (MR) measurement sequence. The method includes the radiation of a multidimensional, spatially-selective RF excitation pulse using associated excitation gradient fields to excite a transversal magnetization in a predetermined region. The method furthermore includes the acquisition of a number of calibration gradient echoes of the excited transversal magnetization using associated positive and negative calibration gradient fields, wherein the calibration gradient echoes respectively provide calibration data of a k-space line. The method furthermore includes the determination of a respective phase response of the calibration data and the determination of a respective phase shift of the calibration data. The method furthermore includes the calculation of a phase correction of the multidimensional, spatially-selective RF excitation pulse based on the phase shift, and the calculation of a time correction of the multidimensional, spatially-selective RF excitation pulse based on the phase response. The method furthermore includes the radiation of an additional multidimensional, spatially-selective RF excitation pulse using the phase correction and the time correction.

For example, the k-space line can include the k-space center. For example, the phase shift of the calibration data can be a phase shift relative to a reference phase, for example of a corresponding MR system. The phase response can designate a change of the phase of the calibration data as a function of the frequency. It can be possible to associate the phase shift with a corresponding phase correction of the RF excitation pulse in the time domain, and to associate the phase response with a time shift in the time domain of the RF excitation pulse (for example relative to a radio-frequency of the RF excitation pulse or relative to the excitation gradient fields). The time correction can thus be produced via targeted delay or earlier radiation of the additional multidimensional, spatially-selective RF excitation pulse.

Methods that allow the determination of the phase response and the determination of the phase shift from the calibration data are known to those skilled in the art from the literature. For example, DE 44 45 782 C1 discloses techniques for that purpose. However, it should be noted that, despite certain statements in DE 44 45 782 C1, the retroactive determination of the phase errors (i.e. the phase response and the phase shift or the calculation of the corresponding correction values) cannot correct (or can correct only to a limited extent) the incorrect excitation in this regard due to the multidimensional RF excitation pulse. This is the case since the excitation of the transversal magnetization has already concluded at the point in time that the correction values are made available, and therefore the excitation can no longer be changed. Therefore, the subsequently excited transversal magnetization can be used via the re-radiation of the further multidimensional, spatially-selective RF excitation pulse, under consideration of the correction values (for a corresponding imaging acquisition sequence, for example).

The multidimensional, spatially-selective RF excitation pulse and the predetermined region can be defined in a patient coordinate system. The radiation can take place along defined axes of an MR system coordinate system that result from a coordinate transformation from the patient coordinate system into the MR system coordinate system. The MR system coordinate system can also be designated as a machine coordinate system. For example, the patient coordinate system can be the PGS coordinate system. In particular, the patient coordinate system can be adapted to an anatomy of an examination subject, i.e. be oriented along the primary anatomical planes, for example. The MR system coordinate system can be significantly determined by the arrangement of gradient coils which generate the gradient fields, for example, thus be oriented along the gradient axes. This means that the spatial coding can advantageously be established or, respectively, defined with regard to this patient coordinate system.

For example, in the event that it is necessary a gradient field which is oriented along a defined axis in the patient coordinate system can be radiated along the different axes of the MR system coordinate system via a superposition of two or three gradient fields. For example, this can in particular be the case when the phase axis of the patient coordinate system is rotated relative to the MR system coordinate system.

Furthermore, the method can include the detection of MR data with an imaging gradient echo sequence using acquisition gradient fields to acquire the MR data from exceptional [sic] gradient echoes, wherein the MR data image the predetermined region, and wherein the acquisition gradient fields are defined in the patient coordinate system. For example, an MR image can be created from the MR data.

The method can furthermore include the correction of the MR data by removing the phase response and the phase shift. It should be understood that the MR data can be retroactively corrected (for example by subtracting the phase response and the phase shift) even after concluding the detection of the MR data with the imaging gradient echo sequence. It should be understood that a corresponding correction after the fact with regard to the multidimensional, spatially-selective RF excitation pulse cannot be possible, or can be possibly only to a limited extent, since the incorrect excitation of the transversal magnetization can significantly affect all subsequent method steps.

Furthermore, the method can include the acquisition of a number of additional calibration gradient echoes of the excited transversal magnetization using associated additional positive and negative calibration gradient fields, wherein the additional calibration gradient echoes respectively provide additional calibration data of a k-space line. The method can furthermore include the determination of a respective additional phase response of the additional calibration data and the determination of a respective additional phase shift of the additional calibration data. Furthermore, the method can include the calculation of an additional phase correction based on the additional phase shift, and the calculation of an additional time correction based on the additional phase response, and the correction of the MR data by removing the additional phase response and the additional phase shift.

The k-space line of the additional calibration data can in turn include the k-space center. In other words: the method according to the presently discussed aspect of the invention can include the determination of correction values separately for the excitation on the one hand (i.e. the multidimensional, spatially-selective RF excitation pulse) and for the imaging on the other hand (i.e. the gradient echo sequence to detect the MR data). This can allow the calibration parameters to be adapted particularly well to both cases, and to enable a particularly precise determination of the phase errors or, respectively, calculation of the correction values (phase correction and time correction).

A duration of the additional calibration gradient fields can hereby be equal to a duration of the acquisition gradient fields and/or an amplitude of the additional calibration fields can be equal to an amplitude of the acquisition gradient fields. It can be possible that the phase errors (i.e. the phase response and the phase shift) are dependent on the duration of the corresponding gradient fields and/or their amplitude. The adjusted parameters can then allow a particularly high precision of the correction values.

A duration of the calibration gradient fields can accordingly be equal to a duration of the excitation gradient fields and/or an amplitude of the calibration gradient fields can be equal to an amplitude of the excitation gradient fields. A particularly precise determination of the phase errors is possible by matching the additional calibration gradient fields to the corresponding parameters of the acquisition gradient fields of the gradient echo sequence, or by matching the parameters of the calibration gradient fields to the parameters of the corresponding excitation gradient fields of the RF excitation pulse. For example, the phase errors themselves can namely be dependent on the amplitude or, respectively, the duration of the gradient fields. If the parameters for the excitation gradient fields and the acquisition gradient fields differ, it can thus be desirable to determine separate correction values. However, it is also possible to use the correction values which are obtained from the phase response and the phase shift (i.e. from the calibration gradient fields) for the acquisition gradient fields as well. This can allow a time required to implement the calibration (i.e. for a calibration acquisition sequence) to be reduced since fewer calibration gradient echoes must be acquired.

The acquisition of the number of calibration echoes, the determination of the phase response and the phase shift, and the calculation of the phase correction and the time correction can respectively take place along those axes of the patient coordinate system for which the multidimensional, spatially-selective RF excitation pulse is defined. The k-space line can respectively be arranged along one axis of the patient coordinate system.

In other words: the phase shift and the phase response for which an excitation gradient field is used during the RF excitation pulse and/or the additional RF excitation pulse can be determined for precisely those axes of the patient coordinate system. This can allow the number of required calibration gradient echoes to be limited so that a particularly fast acquisition of the number of calibration gradient echoes is possible. It can also allow the phase errors to be determined for all axes of the patient coordinate system that are used. The k-space line can then be arranged along the respective corresponding axis of the patient coordinate system.

The calculation of the phase correction and the calculation of the time correction can take place individually for the axes of the patient coordinate system, and that the radiation of the additional multidimensional, spatially-selective RF excitation pulse takes place based on the calculated individual phase corrections and time corrections for the axes of the patient coordinate system.

In other words: the corresponding steps of the acquisition of the calibration gradient echo, the determination of the phase errors and the calculation of the correction values can respectively take place separately and/or sequentially for the different axes of the patient coordinate system, for example for those axes which are used during the RF excitation pulse. It can then be possible to calculate the correction values individually, which can enable an increased precision in the determination.

It is also possible for the acquisition of the number of calibration gradient echoes, the determination of the phase response and the phase shift and the calculation of the phase correction and the time correction to respectively take place along three orthogonal axes of the MR system coordinate system. The k-space line can be arranged along an axis of the MR system coordinate system.

In other words, it can be possible to determine the correction values separately and/or sequentially for all three axes of the MR system coordinate system. In particular, the phase errors or parts of the phase errors can be dependent on the respective channel of a gradient system of the corresponding MR system. Therefore, the individual acquisition of calibration echoes for the three gradient axes of the MR system coordinate system (which are established by the three channels of the gradient system of the corresponding MR system, for example) have the effect that the different phase errors can be determined individually, and that the correction values can be calculated based on these. This can enable a particularly precise calculation of the correction values.

Given existing correction values for all axes in the MR system coordinate system, it can be possible to correct arbitrarily oriented excitation gradient fields which are defined in the patient coordinate system. This is the case since an excitation gradient field can be represented by a superposition of corresponding gradient fields in the MR system coordinate system.

The calculation of the phase correction and the calculation of the time correction can take place individually for the three orthogonal axes of the MR system coordinate system, wherein the radiation of the additional multidimensional, spatially-selective RF excitation pulse takes place based on the calculated individual phase corrections and time corrections for the three orthogonal axes of the MR system coordinate system.

The number of calibration gradient echoes can be equal to 3, wherein two positive gradient fields and one negative gradient field are used, and wherein the method furthermore includes the averaging of the two calibration gradient echoes with associated positive gradient field. In particular, the averaging of those calibration gradient echoes can take place with associated positive calibration gradient field before the determination of the phase errors. The phase errors can then be determined for two calibration data, i.e. with positive and negative gradient field.

According to a further aspect, the invention concerns an MR system that includes a transmission system that is configured in order to radiate a multidimensional, spatially-selective RF excitation pulse using associated excitation gradient fields to excite a transversal magnetization in a predetermined region. The MR system furthermore has a receiver system which is configured to acquire a number of calibration gradient echoes of the excited transversal magnetization using associated positive and negative calibration gradient fields, wherein the calibration gradient echoes respectively provide calibration data of a k-space line. The MR system furthermore has a calibration unit which is configured to implement the following steps: determine a respective phase response of the calibration data; and determine a respective phase shift of the calibration data; and calculate a phase correction of the multidimensional, spatially-selective RF excitation pulse based on the phase shift; and calculate a time correction of the multidimensional, spatially-selective RF excitation pulse based on the phase response. The RF transmission system is furthermore configured to radiate an additional multidimensional, spatially-selective RF excitation pulse using the phase correction and the time correction.

For such an MR system, effects are achieved that correspond to those achieved for the above-described method to correct phase errors in multidimensional, spatially-selective RF excitation pulses in MR imaging.

One aspect of the invention concerns a method to continuously correct phase errors in a magnetic resonance (MR) measurement sequence in which multiple sequentially radiated multidimensional, spatially-selective radio-frequency (RF) excitation pulses with different excitation parameters are used. The method includes the radiation of a multidimensional, spatially-selective radio-frequency (RF) excitation pulse to excite a transversal magnetization with defined excitation parameters. The method furthermore includes the acquisition of a plurality of calibration gradient echoes of the excited transversal magnetization and the calculation of a correction value for a phase response of the RF excitation pulse and a correction value for a phase difference of the RF excitation pulse from the plurality of calibration gradient echoes. The method furthermore includes the detection of MR data with an imaging acquisition sequence, wherein the acquisition sequence concerns the transversal magnetization with the defined excitation parameters and the radiation of an additional multidimensional, spatially-selective RF excitation pulse to excite an additional transversal magnetization with additional defined excitation parameters, wherein the radiation of the additional RF excitation pulse takes into account the calculated correction value for the phase response and the calculated correction value for the phase difference.

For example, the acquisition sequence can be a gradient echo acquisition sequence or a spin echo acquisition sequence. For example, the excitation parameters of the RF excitation pulses can relate to a defined region in the inside of a body of an examination subject or, respectively, other parameters, for example a trajectory with which k-space is scanned during the radiation of the RF excitation pulse. Possible trajectories are, for example: spiral-shaped, line-by-line or radial. Corresponding embodiments of such multidimensional, spatially-selective RF excitation pulses are known to the man skilled in the art, for example from the aforementioned publication by S. Riesenberg et al.

The acquisition of the multiple calibration gradient echoes can be implemented within the scope of a calibration acquisition sequence, for example. The calculation of the correction values for the phase response and the phase difference—i.e. for the phase errors—can be implemented by means of known techniques as they are known from DE 44 45 782 C1, for example. For example, two or three calibration gradient echoes with different algebraic sign of the associated calibration gradient fields can be acquired in this regard. For example, two calibration gradient fields with positive algebraic sign and one with negative algebraic sign can be used. The correction values can concern a time shift of an amplitude of the RF excitation pulse relative to excitation gradient fields used within the scope of the RF excitation pulse, or relative to the RF components of the RF excitation pulse. Such a time shift can typically produce the phase response in the frequency domain (change of the phase over the frequency).

It should be noted that the RF excitation pulse and the additional RF excitation pulse can respectively have different excitation parameters: the correction of the additional RF excitation pulse with the correction values that are determined for the first radiated RF excitation pulse can inasmuch be inherently error-plagued. However, a balance between a precision of the correction and a measurement duration can favor the corresponding techniques.

Moreover, a continuously adapted correction of the phase errors over the duration of the MR measurement sequence can be achieved via the successive consideration of the calculated correction values for the phase response and the phase difference in the radiation of the additional multidimensional, spatially-selective RF excitation pulse. This can in particular have advantages with regard to time dependencies of the phase errors. For example, the phase errors can be produced by the eddy currents or, respectively, drifts or movements of the examination subject and/or the components of the corresponding MR system, such that the consideration of respective current correction values for the phase response and the phase difference enables an improved precision—in particular in contrast to a one-time calibration at the beginning of the measurement sequence.

At least portions of the calculation of the correction value and the detection of the MR data can occur simultaneously. It is also possible for the calculation of the correction value to be terminated at the end of the detection of the MR data. Since the calculation of the correction values for the phase response and for the phase difference does not require any particularly large computing capacities, it can be concluded within a few milliseconds even in conventional MR systems. This can enable the correction values to be finally calculated during the implementation of the acquisition sequence, which typically has a duration of a few 10's of milliseconds up to 1 second. This can enable the correction values to be finally calculated at the point in time of the radiation of the subsequent additional multidimensional, spatially-selective RF excitation pulse, and thus to be taken into account.

Furthermore, the method can include the correction of the detected MR data, based on the calculated correction value for the phase response and/or based on the calculated correction value for the phase difference. For example, the correction value for the phase response and/or for the phase difference can be retroactively subtracted from the MR data (i.e. after the detection within the scope of a post-processing of the MR data, for example), such that corrected MR data are obtained which have no or only slight phase errors, in particular in comparison to the uncorrected MR data. This can produce an accuracy in MR imaging or physical measurement values derived from the MR data, for example diffusion coefficients etc. In other words: an uncertainty in the derived physical measurement variables can be smaller.

The method can furthermore include the detection of additional MR data with the acquisition sequence, wherein the acquisition sequence concerns the additional transversal magnetization, and wherein the detection of the additional MR data occurs based on the calculated correction value for the phase response and the calculated correction value for the phase difference. While it is possible (as explained above) to subsequently correct the detected MR data based on the correction values, it can also be possible to already reduce or suppress the phase errors in advance during the implementation of the acquisition sequence via suitable corrections (for example of acquisition gradient fields used in the acquisition sequence). This can produce an improved precision of the detected MR data since phase errors can already be avoided during the implementation of the acquisition sequence.

The method can furthermore include the implementation of a pre-calibration at the beginning of the MR measurement sequence, wherein the pre-calibration determines phase errors of k-space trajectories and, based on these, provides an initial correction value for the phase response and an initial correction value for a phase difference, wherein the radiation of the RF excitation pulse and the detection of the MR data occur based on the calculated initial correction value for the phase difference.

For example, comprehensive and relatively time-intensive calibration acquisition sequences (as they are known to the man skilled in the art from, for example, the aforementioned publications by M. Oelhafen et al. and J. T. Schneider et al.) can be used for the pre-calibration. Such pre-calibrations can provide the phase errors with a k-space spatial resolution, for example, such that respective initial correction values for the phase response and the phase difference can be available for the most varied RF excitation pulses which (for example) pertain to different regions of k-space.

Furthermore, the method described above for the continuous correction of the phase errors can respectively allow the sequential correction of subsequent further RF excitation pulses with correction values calculated beforehand. However, the implementation of the pre-calibration can allow that corresponding correction values for the phase response and the phase difference can already be taken into account for the first radiated, spatially-selective RF excitation pulse of the MR measurement sequence.

The pre-calibration can furthermore include the radiation of an initial multidimensional, spatially-selective RF excitation pulse to excite an initial transversal magnetization with defined initial excitation parameters and the acquisition of a number of initial calibration gradient echoes of the initial transversal magnetization. The pre-calibration can furthermore include the calculation of the initial correction value for the phase response of the initial RF excitation pulse and the initial correction value for the phase difference of the initial RF excitation pulse from the number of initial calibration gradient echoes.

The MR measurement sequence can concern a functional magnetic resonance tomography, or a diffusion magnetic resonance tomography, or a perfusion magnetic resonance tomography. Corresponding techniques are known to the man skilled in the art. However, it is common to all of these techniques that multiple RF excitation pulses are used sequentially, for example in order to detect MR data for different slices and/or regions of the examination subject and/or in order to detect MR data for different diffusion codings. In every case it is possible to consider the calculated correction values for the phase difference and the phase response for respective subsequent RF excitation pulses, for example in particular for the immediately following RF excitation pulse.

The calculation of the correction value for the successive additional RF excitation pulse can be repeated essentially over the entire duration of the MR measurement sequence. This can enable a time dependency of the phase errors to be taken into account via continuous recalculation of the correction values, and thus enable the corresponding time-dependent errors to be minimized.

The correction value for the phase response can pertain to a time correction of the additional multidimensional, spatially-selective RF excitation pulse, and the correction value for the phase difference can pertain to a phase correction of the additional multidimensional, slice-selective RF excitation pulse. For example, the correction value can pertain to the phase response in the slice-selection direction. The phase difference can designate a difference between two echoes (i.e. echo to echo), for example. A phase response in the frequency domain can pertain to a time shift of the RF excitation pulse relative to the radio-frequency or the excitation gradient field that is used.

According to a further aspect, the invention concerns a magnetic resonance system (MR system) that has a transmission system, a reception system, and a calibration unit. The transmission system is configured in order to radiate a multidimensional, spatially-selective RF excitation pulse to excite a transversal magnetization with defined excitation parameters. The reception system is configured in order to acquire a plurality of calibration gradient echoes of the excited magnetization and in order to detect MR data with an imaging acquisition sequence, wherein the acquisition sequence produces the transverse magnetization according to the defined excitation parameters. The calibration unit is configured in order to calculate a correction value for a phase response of the RF excitation pulse and a correction value for a phase difference of the RF excitation pulse from the plurality of calibration gradient echoes. Furthermore, the transmission system is configured to radiate an additional multidimensional, spatially-selective RF excitation pulse to excite an additional transversal magnetization with additional defined excitation parameters, wherein the radiation of the additional RF excitation pulse takes into account the calculated correction value for the phase response and the calculated correction value for the phase difference.

For such an MR system, effects can be achieved that correspond to those achieved by the above-described method to continuously correct phase errors according to the present invention.

BRIEF DESCRIPTION OF THE DRAWINGS

FIG. 5 illustrates a phase response and a phase difference as well as associated correction values, i.e. a time correction and a phase correction.

FIG. 6 illustrates an MR measurement sequence according to the invention which uses calibration gradient echoes to determine the correction values.

FIG. 7 illustrates an additional MR measurement sequence according to the invention which provides correction values for three axes of the MR system coordinate system.

FIG. 8 illustrates an additional MR measurement sequence according to the invention which provides correction values for three axes of the patient coordinate system.

FIG. 9 illustrates an additional MR measurement sequence according to the invention which includes calibration gradient echoes for correction values of the RF excitation pulse as well as additional calibration gradient echoes for correction values of the acquisition sequence to detect MR data.

FIG. 10 illustrates a functional MR measurement sequence.

FIG. 11 illustrates a diffusion MR measurement sequence.

FIG. 13 is a flowchart of the method to continuously correct the phase errors of FIG. 12.

FIG. 14 is a flowchart of a method to correct phase errors which in particular illustrates the determination of a phase correction and a time correction in more detail.

DESCRIPTION OF THE PREFERRED EMBODIMENTS

Figure 1:
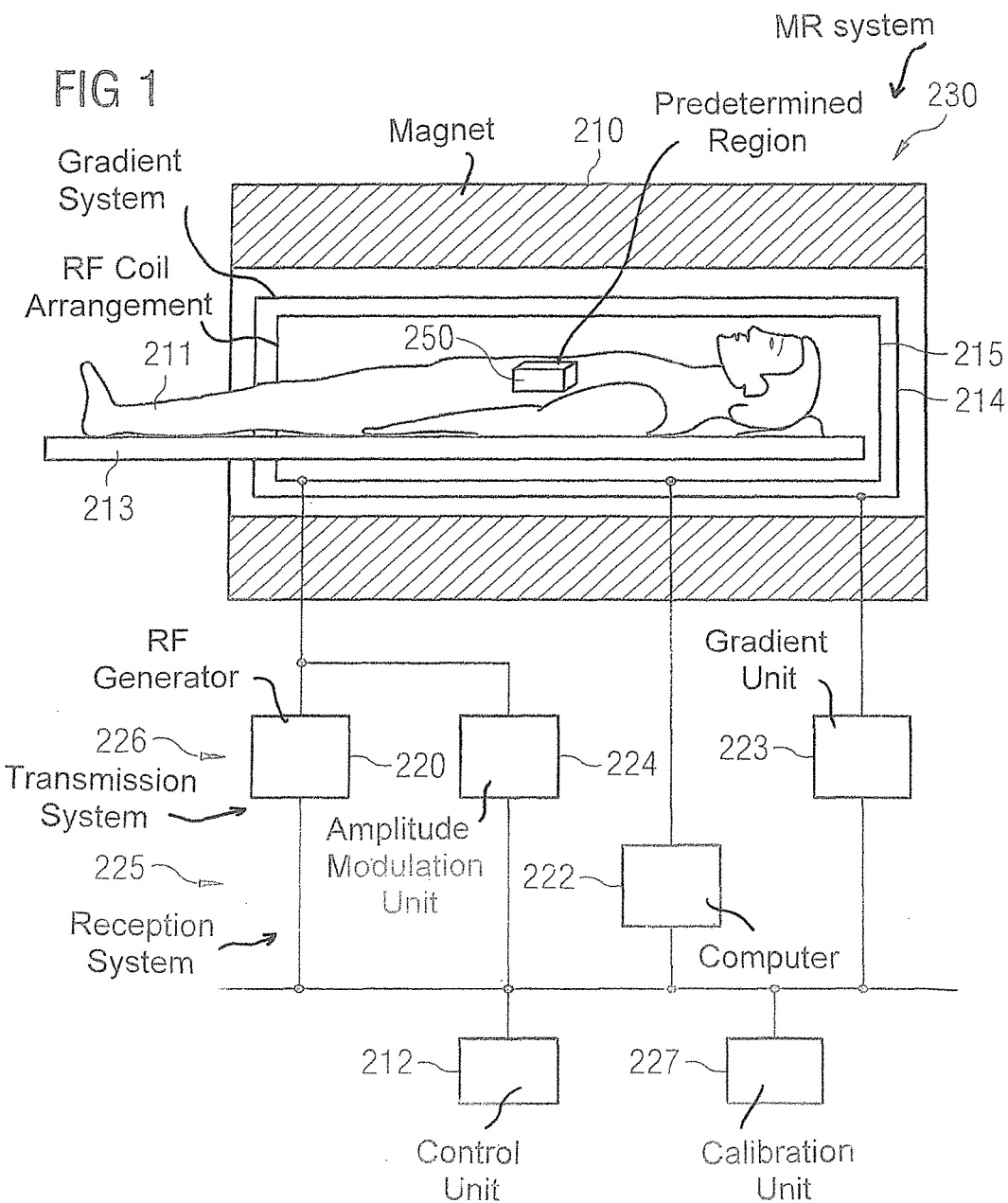
FIG. 1 is a schematic representation of an MR system according to the invention.

The present invention is explained in detail in the following using preferred embodiments with reference to the drawings. Identical reference characters the figures designate identical or similar elements.

FIG. 1 schematically shows a magnetic resonance (MR) system 230 according to an embodiment of the present invention. The MR system 230 has a magnet 210 to generate a basic magnetic field. For example, the magnet 210 can be a tube magnet and the basic magnetic field can be situated parallel to the longitudinal axis of the tube. An examination subject—here an examined person 211—on a bed or table 213 can be slid into the magnet 210. The MR system 230 furthermore has a gradient system 214 to generate magnetic field gradients that are used for the imaging and spatial coding of acquired MR data. The gradient system 214 typically has at least three separately controllable coils or coil sets which enable gradient fields to be applied and switched along defined spatial directions (gradient axes). The corresponding coils are designated as channels of the gradient system 214.

Figure 2:
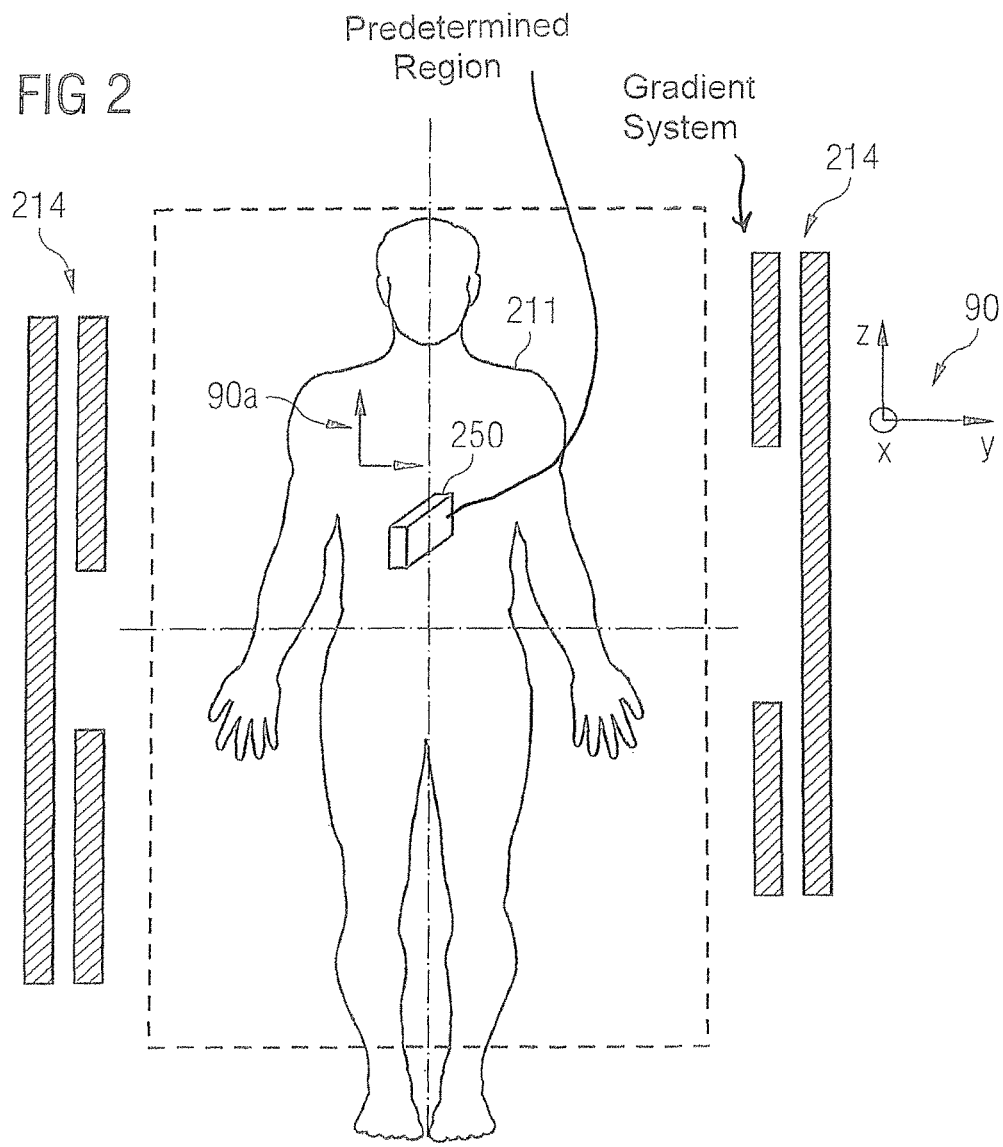
FIG. 2 illustrates a gradient system of the MR system from FIG. 1, as well as a patient coordinate system and an MR system coordinate system.

This is illustrated in detail in FIG. 2. The gradient system 214 is schematically illustrated there. The six coils (hatched shading) shown there as examples can be controlled separately. In particular, gradient fields can be applied along (for example) x-, y-, z-axes in an MR system coordinate system 90 by means of the gradient system 214 (gradient axes). However, these gradient fields are typically not defined or established in the MR system coordinate system 90 but rather in a patient coordinate system 90a which (for example) corresponds to the PGS coordinate system. The definition can occur from medical/anatomical considerations. Individual axes or multiple axes of the patient coordinate system 90a can be rotated relative to the machine coordinate system 90. The individual control channels of the coils of the gradient system 214 are then controlled by means of coordinate transformation based on the definition in the PGS coordinate system.

Referring again to FIG. 1: to excite the polarization or, respectively, alignment of the magnetization that results in the basic magnetic field, an RF coil arrangement 215 is provided that can radiate an amplitude-modulated RF excitation pulse into the examined person 211 in order to deflect the magnetization out of the steady state (typically parallel to the basic magnetic field), i.e. in order to generate a transversal magnetization. In particular, multidimensional, spatially-selective RF excitation pulses can be used which allow the transversal magnetization to be excited specifically and with defined excitation parameters, for instance a defined k-space trajectory in a predetermined region 250 of the examined person 211. A radio-frequency generator 220 and an amplitude modulation unit 224 are used to generate such RF excitation pulses. A gradient unit 223 is provided to control the gradient system 214. The units 220, 223 and 224 can in particular be operated synchronously as a transmission system 226 for targeted excitation of the transversal magnetization. However, the synchronization can be subject to uncertainties or errors.

A computer 222 of a reception system 225 receives signals of the decaying transversal magnetization (spin echoes and gradient echoes). For this the computer 222 is coupled with RF reception coils. In a particularly simple embodiment, the RF coil 215 is used both for transmission and reception. However, separate RF transmission coils and RF reception coils can be used.

A control unit (operating unit) 212 allows the input and output from and to a user of the MR system 230. The control unit 212 can comprise a monitor, a keyboard, a mouse, storage media, data connections etc., for example.

Furthermore, a calibration unit 227 is provided which enables correction values (for example a phase correction and a time correction) to be calculated for the various components of the transmission system 226. In particular, the calibration unit 227 is suitable to implement these correction values repeatedly during the implementation of an MR measurement sequence so that phase errors of multidimensional, spatially-selective RF excitation pulses can be continuously corrected.

The units of the MR system 230 were presented and discussed separately in FIG. 1. However, specific units can be combined and/or functionally integrated, for example as hardware and/or software. This can pertain to the calibration unit 270, for example.

Figure 3:
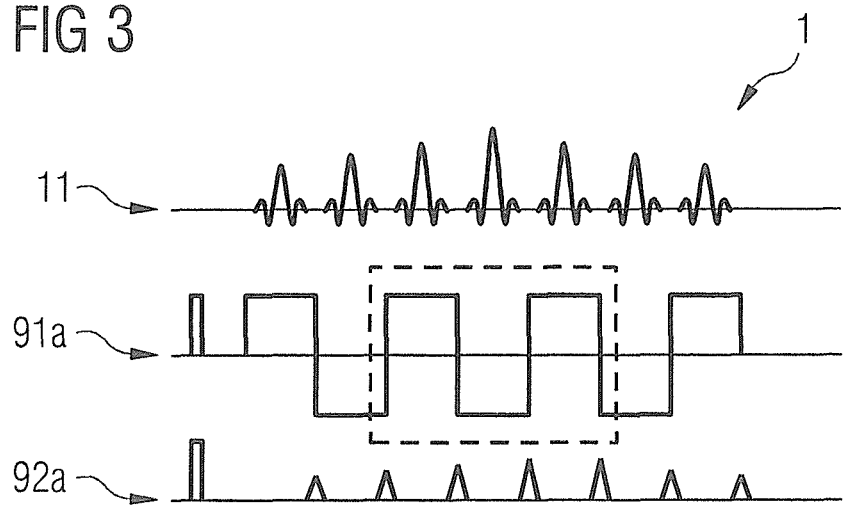
FIG. 3 illustrates a multidimensional, echoplanar, spatially-selective RF excitation pulse.
Figure 4:
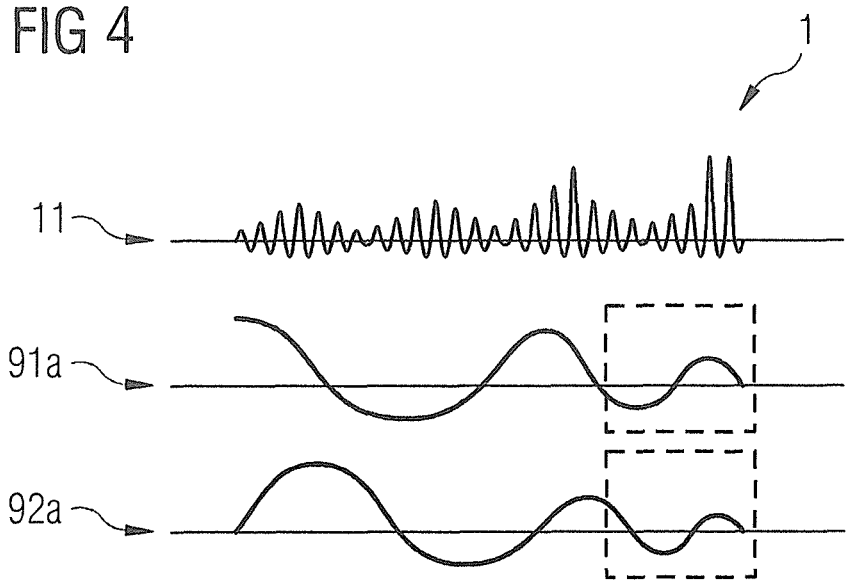
FIG. 4 illustrates an additional multidimensional, spatially-selective RF excitation pulse with a spiral-shaped k-space trajectory.

Two examples (that are purely illustrative and not limiting) of the excitation of the transversal magnetization by means of multidimensional, spatially-selective RF excitation pulses 1 are shown in FIGS. 3 and 4. The amplitude 11 of the RF excitation pulse 1 is shown in the uppermost line while the subsequent lines show the gradient fields along two axes 91a, 92a (for example phase coding and slice selection direction) of the patient coordinate system 90a. In FIG. 3 the excitation takes place using the "blipped EPI" technique (already mentioned above). A spiral-shaped k-space trajectory is excited in FIG. 4. The portion of the RF excitation pulse 1 which corresponds to a k-space center (disappearing wave vector, associated wavelengths of the magnetization dynamic to infinity) is respectively marked with a dashed line in FIGS. 3 and 4. Depending on the concrete object that is posed, the most varied multidimensional, spatially-selective RF excitation pulses 1 can be used. The most varied techniques for this are known to the man skilled in the art, for instance from the aforementioned publication by S. Riesenberg et al. Therefore there is no need to explain additional details in this context.

Possible phase errors 100, 101 of such RF excitation pulses 1 are illustrated in detail in FIG. 5. FIG. 5 shows the time domain (labeled with "t") to the left while the frequency domain (labeled with "f") is shown to the right. FIG. 5 shows the respective amplitude 11 of the RF excitation pulse above while the phase 11a of said RF excitation pulse 1 is respectively shown below (for instance relative to an arbitrary reference phase, for example a reference phase of the RF transmission system 226, for example of a numerically controlled oscillator).

From the plotting of phase 11a over the frequency (to the lower right in FIG. 5) it is clear that the RF excitation pulse 1 can have both a phase response 100 (i.e. a change of the phase 11a over the frequency f) and a phase difference 101 (i.e. an offset of the phase relative to a reference null value). Such phase errors can produce artifacts in subsequently detected MR data. As has been presented above, these phase errors can have the most varied causes.

The phase response 100 is caused by a time shift of the amplitude 11 relative to (for instance) the gradient fields and/or the radio-frequency of the RF excitation pulse 1 (see FIG. 5, upper left). The phase response 101 can be caused by a time-independent phase shift 101 (see FIG. 5, lower left). In the following, techniques are presented that allow the time correction 110 (i.e. the time shift) and the phase correction 111 (i.e. the phase difference) to be determined as correction values for the phase errors.

Portions of a corresponding MR measurement sequence 5 are shown in FIG. 6. The MR measurement sequence 5 begins with the multidimensional, spatially-selective RF excitation pulse 1 (excitation, TX). The RF excitation pulse 1 is radiated together with excitation gradient fields 12 and excites a transversal magnetization with defined excitation parameters. The excitation parameters can relate to the predetermined region 250, concern defined k-space trajectories etc. A calibration acquisition sequence 2 is subsequently implemented. An imaging acquisition sequence 3 is subsequently implemented to detect MR data.

The presentation of the RF excitation pulse 1 in FIG. 6 is purely schematic. It should be noted that a number of different multidimensional, spatially-selective RF excitation pulses 1 can be used according to the invention. A significant characteristic of the multidimensional, spatially-selective RF excitation pulses 1 is their ability to be adapted with regard to the parameters that are used. In the case of FIG. 6, excitation gradient fields along two axes 91a, 92a of the patient coordinate system 90a are used.

In FIG. 6, the acquisition sequence 3 is a "blipped" gradient echo sequence which includes acquisition gradient fields 32 to detect the MR data from acquisition gradient echoes 31. The RF signals from which the MR data are obtained are shown in the signal column 10 in FIG. 6. In general, any acquisition sequence 3 at all can be used, thus for instance a spin echo acquisition sequence.

The calibration acquisition sequence 2 allows the time correction 110 and the phase correction 111 for the RF excitation pulse 1 to be calculated. This is explained in detail in the following. The calibration acquisition sequence 2 includes the acquisition of three calibration gradient echoes 21 along an axis 91a of the patient coordinate system 90a using an associated two positive calibration gradient fields 22a and one negative calibration gradient field 22b. The calibration gradient fields 22a, 22b are selected such that the calibration gradient echoes 21 provide respective calibration data of a k-space line that—in various embodiments—advantageously includes the k-space center (see dashed lines in FIGS. 3 and 4). The phase response 100 and the phase difference 101 can be determined from the calibration data. Techniques as disclosed in DE 44 45 782 C1 (for example) are known for this to those skilled in the art. In this regard it is noted that it is also possible to use a smaller number (two, for instance) or a larger number of calibration gradient fields 22a, 22b (for example two negative calibration gradient fields). In particular, for example, the two calibration gradient echoes 21 that belong to the positive gradient fields 22a can be averaged before the phase response 100 and the phase difference 101 are determined. This can increase a precision of the correction values 110, 111.

Independently of this, a time correction 110 and a phase correction 111 for the axis 91a, can be calculated from the phase errors 100, 101 of the RF excitation pulse 1 that are determined in such a manner. The phase errors 100, 101 can also be used to correct the MR data from the acquisition sequence 3, for instance via subtraction from the MR data. However, since the RF excitation pulse 1 has already been radiated at the point in time of the calculation of the corrections 110, 111, its excitation parameters and errors can no longer be retroactively corrected. However, given MR measurement sequences 5 in which a number of such sequentially radiated multidimensional, spatially-selective RF excitation pulses 1 are used, according to the most varied embodiments respective, successive additional RF excitation pulses 1 are corrected with the calculated corrections 110, 111, for example essentially over the entire duration of the MR measurement sequence 5.

In FIG. 6 the correction values 110, 111 are determined only for the axis 91a of the patient coordinate system 90a. However, it would also be possible to determine the correction values for other/additional axes. Such scenarios are illustrated schematically in FIGS. 10 and 11 with regard to MR measurement sequences 5 which use a plurality of multidimensional, spatially-selective RF excitation pulses 1. For example, FIG. 10 concerns an fMR measurement sequence 5 in which MR data are sequentially detected for various regions 250a-250c of the examined person 211 that include different slices 50a-50i. for example, the propagation of a contrast agent over the regions 250a-250c can be monitored. A diffusion or perfusion measurement sequence 5 is shown in FIG. 11. MR data are respectively detected for the same region 250 for a lower number of slices 50a, 50c. The MR data are hereby detected with different diffusion weightings 52a, 52b.

A multidimensional, spatially-selective RF excitation pulse 1 can respectively be radiated with the corresponding excitation parameters for each of the slices 50a-50i in FIGS. 10 and 11, for example. The most current (i.e. the most recently determined) corrections 110, 111 can then be respectively taken into account for sequentially radiated RF excitation pulses 1.

Figure 12:
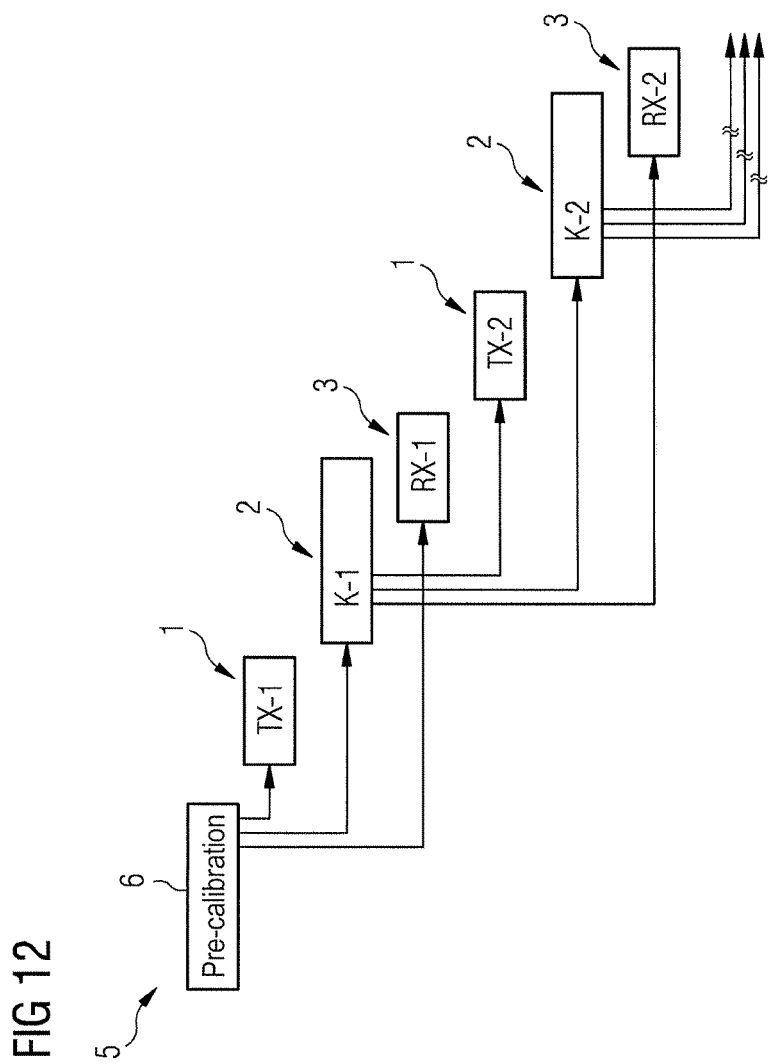
FIG. 12 is a time workflow diagram of a method to continuously correct phase errors in MR measurement sequences.

This is illustrated in detail in the time workflow diagram of FIG. 12. A pre-calibration 6 is initially implemented at the beginning of the measurement sequence 5. For example, the pre-calibration can determine phase errors 100, 101 for k-space trajectories. The pre-calibration can include the radiation of at least one initial multidimensional, spatially-selective RF excitation pulse 1 to excite an initial transversal magnetization with defined initial excitation parameters and the acquisition of a plurality of initial calibration gradient echoes of the individual transversal magnetization. An initial correction value 110 for the phase response 100 and an initial correction value 111 for the phase difference 101 can be calculated from these. For example, techniques according to the aforementioned publication by M. Oelhafen and J. T. Schneider can be used for the pre-calibration 6. In particular, the pre-calibration can determine the phase errors with a k-space resolution so that a set of correction values 110, 111 is available for the subsequent RF excitation pulses 1. In particular, the pre-calibration 6 can also provide an initial correction value for the phase response 100 and an initial correction value for the phase difference 101. The radiation of the first RF excitation pulse 1 and the first calibration acquisition sequence 2 can then occur based on the calculated initial correction values 110, 111, as is represented by the arrows in FIG. 12.

The calibration acquisition sequence 2 is implemented following the first RF excitation pulse 1. The acquisition sequence 3 can begin as soon as the calibration gradient echoes 21 are detected, meaning that the acquisition gradient echoes 21 can be applied and the MR data can be detected. The calculation of the correction values 110, 111 from the detected calibration gradient echoes 21 and the detection of the MR data can be viewed as being at least partially simultaneous, as is represented by the temporal overlap of sequences 2 and 3 in FIG. 12. In particular, the calculation of the correction values 110, 111 can be concluded at the end of the detection of the MR data, i.e. before the end of the acquisition sequence 3. The correction values 110, 111 that are obtained in such a manner can then be used for the subsequent RF excitation pulse 1 or for the subsequent acquisition sequence 3.

In specific embodiments, the respective most recent correction values 110, 111 can also be taken into account for the subsequent calculation of new correction values 110, 111. This is presented in FIG. 12 but is to be understood as optional. For example, a mean calculation (for example relating to a sliding mean value) can take place and/or the residual deviation from the preceding defined correction value can be determined and additionally applied.

The determination of the phase response 100 and the phase shift 101 and the calculation of the corrections 110, 111 can take a few milliseconds, depending on system design and available computing capacities. This can in particular mean that the implementation of the corresponding method steps can be implemented in parallel with the acquisition sequence 3 or is finally concluded at the end of the acquisition sequence 3. This can allow the correction parameters 110, 111 for the acquisition gradient fields 32 to be considered for a subsequent acquisition sequence 3 that detects additional MR data.

The chronological workflow of the various portions of the measurement sequence 5 or, respectively, their correlations were discussed in the preceding. The following explains in detail how the calibration acquisition sequence 2 can be designed in various embodiments. Referring again to FIG. 6, wherein the gradient fields 12, 22a, 22b, 32 are defined in the patient coordinate system 90a: it should be understood that this results in a transformation into the MR system coordinate system 90 such that the control of the gradient system 214 can be implemented accordingly. The phase errors 100, 101 are also measured with regard to the patient coordinate system 90a in the embodiment of FIG. 6.

However, it can be desirable to measure the phase errors 100, 101 individually for the various axes of the MR system coordinate system 90, i.e. for the individual channels of the gradient system 214. This is the case since different error sources can be specific to the channels of the gradient system 214, for instance time differences etc. A corresponding embodiment is illustrated in FIG. 7.

The excitation gradient fields 12 for the axes 91, 92, 93 of the MR system coordinate system 90 are shown in FIG. 7. As is clear from the comparison of FIG. 7 with FIG. 6, for example, in general the application of a gradient along the phase, gradient or slice direction 91a, 92a, 93a can produce a superposition of the gradient fields 12 (for example via parallel operation of the calibration unit 227 and the transmission system 226) in the MR system coordinate system 90. In FIG. 7, calibration gradient echoes 21 are detected separately for all three orthogonal axes 91, 92, 93 of the MR system coordinate system 90. The correction values 110, 111 can then be calculated separately for these axes 91, 92, 93. Furthermore, In FIG. 7 the amplitude and the duration of the excitation gradient fields 12 for the axes 91, 92, 93 are respectively identical to the amplitude and duration of the calibration gradient fields 22a, 22b.

In general, an embodiment of FIG. 7 can be particularly desirable if the coordinate systems 90, 90a are not congruent or are significantly different. For example, this can in particular be the case when the phase coding direction of the patient coordinate system is tilted relative to the axes of the MR system coordinate system 90.

An additional embodiment is presented in FIG. 8. The gradient fields 12, 22a, 22b, 32 are in turn shown in the patient coordinate system 90a. In contrast to the embodiment of FIG. 6, three respective calibration gradient echoes 21 are acquired for all three axes 91a, 92a, 93a of the patient coordinate system 90a.

A further embodiment is shown in FIG. 9. The RF excitation pulse 1, the calibration acquisition sequence 2 and the acquisition sequence 3 essentially correspond to the embodiment of FIG. 6 as it has been discussed in the preceding. Moreover, In FIG. 9 an additional calibration acquisition sequence 4 is used in which (corresponding to the calibration acquisition sequence 2) three additional calibration gradient fields 42 are used in order to detect three additional calibration gradient echoes 41. With regard to the additional calibration acquisition sequence 4, the number of additional calibration gradient fields 42 and additional calibration gradient echoes 41 is also variable. The additional calibration gradient echoes 41 respectively provide additional calibration data of a k-space line comprising the k-space center, which k-space line can be used (corresponding to the calibration data of the calibration echoes 21 as explained in the preceding) to determine additional phase errors 100, 101. It is then possible to correct the MR data (as they are acquired from the acquisition sequence 3) with the additional phase errors 100, 101.

The parameters of the further calibration acquisition sequence 4 can be matched to the parameters of the acquisition sequence 3, while the parameters of the calibration acquisition sequence 2 can be matched to the RF excitation pulse 1. By using separate calibration acquisition sequences 2, 4 for the respective correction of the phase errors 100, 101 of the RF excitation pulse 1 or the MR data from the acquisition sequence 3, it is possible to respectively match a duration 24, 44 and an amplitude 23, 43 of the calibration gradient fields 22a, 22b, 42 to a duration 14, 34 and an amplitude 13, 33 of the excitation gradient fields 12 and the acquisition gradient fields 32, for example to equate them as indicated by the horizontal dashed lines in FIG. 9. Specific causes of the phase fields 100, 101 (for instance eddy currents) can namely have a dependency on the duration 14, 24, 34, 44 and/or the amplitude 13, 23, 33, 43 of the gradient fields 12, 22a, 22b, 32, 42. The corresponding differentiation between the calibration acquisition sequence 2 and the additional calibration acquisition sequence 4 thus enables a particularly precise correction of the phase errors 100, 101.

A flowchart of a method to continuously correct phase errors in an MR measurement sequence 5 that includes a plurality of sequentially arranged, multidimensional, spatially-selective RF excitation pulses 1 with various excitation parameters is shown in FIG. 13. The method begins in Step S1. The pre-calibration 6 to determine the initial correction value for the phase difference 101 and the initial correction value for the phase response 100 is initially implemented in Step S2.

The multidimensional, spatially-selective RF excitation pulse 1 is subsequently radiated in Step S3 to excite the transverse magnetization. In particular, the radiation takes place using the initial correction values for the phase response 100 and the phase difference 101 as they were determined in Step S2. These correction values are namely the most current available correction values.

The calibration acquisition sequence 3 is subsequently implemented in Step S4, meaning that the plurality of calibration gradient echoes 21 is acquired using positive and negative calibration gradient fields 22a, 22b.

The calculation of the current correction value 110 for the phase response 100 and the current correction value 111 for the phase difference 101 subsequently takes place in Step S5. For example, the calculation can be implemented by the calibration unit 227. In Step S6 the acquisition sequence 3 is implemented, meaning that the MR data are detected. The detection of the MR data takes place in Step S6 using the transversal magnetization as it is obtained via the radiated RF excitation pulse from Step S3. Steps S5 and S6 can in part take place simultaneously or in parallel, for example.

The correction of the detected MR data from Step S6 takes place in Step S7 with the current correction values for the phase difference 101 and the phase response 100, meaning with the correction values from Step S5. The implementation of Step S6 can also occur at an arbitrary later point in time, for example after the end of the MR measurement sequence 5.

In Step S8 a check is made as to whether additional MR data are required. In particular, in Step S8 a check can be made as to whether the MR measurement sequence 5 has already been completely implemented, or whether additional MR data (from additional slices 50a-50i or for additional diffusion directions 52a, 52b) should be detected. If it is established in Step S8 that additional MR data should be detected, Steps S3-S7 are implemented again. In the new pass of these Steps S3-S7, in Step S3 the correction values 110, 111 from Step S5 (for example of the immediately preceding pass) are taken into account since these are then the most current correction values 110, 111.

In general, the iterative implementation of Steps S3-S7 can thus always take place so that the most current correction values for the phase difference 101 and the goods [sic] response 100 are respectively taken into account. The correction values 110, 111 from Step S5 of the previous pass of Steps S3-S7 can thus respectively be used.

However, if it is established in Step S8 that no additional MR data are required, the method ends in Step S9.

The calculation of the correction values for the phase response 100 and the phase difference 101 as it is implemented in Step S5 of FIG. 13 is presented in, greater detail in FIG. 14 according to a method to correct phase errors in multidimensional, spatially-selective RF excitation pulses 1.

First, calibration data from the calibration gradient echoes 21 are obtained in Step T1. In particular, the calibration data can provide a k-space line which comprises the k-space center. The phase response 100 and the phase shift 101 can be respectively determined for these calibration data of the k-space line in Step T2. For example, the phase shift 101 can be determined relative to a reference phase of the corresponding MR system 230.

The calculation of the phase correction 111 and the calculation of the time correction 110 subsequently take place in Step T3. The calculation of the correction values 110, 111 was explained in detail with regard to FIG. 5.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method of correcting phase errors in a multidimensional, spatially-selective radio-frequency excitation pulse in a magnetic resonance (MR) data acquisition sequence, comprising:

operating an MR data acquisition unit by radiating a multidimensional, spatially-selective radio-frequency (RF) excitation pulse, into a subject in the MR data acquisition unit with associated excitation gradient fields in order to thereby excite transverse magnetization of nuclear spins in a predetermined region of the subject;

operating the MR data acquisition unit in order to detect a plurality of calibration gradient echoes using associated positive and negative calibration gradient fields;

entering said detected calibration gradient echoes from the MR data acquisition sequence, into respective lines of k-space, as calibration data;

supplying said calibration data into a computerized processor and, in said processor, automatically calculating a phase response of the calibration data;

in said processor, also automatically calculating a phase shift of the calibration data;

in said processor, automatically calculating a phase correction of the multidimensional, spatially-selective RF excitation pulse that counteracts said calculated phase shift;

in said processor, also automatically calculating a time correction of the multidimensional, spatially-selective RF excitation pulse that counteracts said calculated phase response;

operating said MR data acquisition unit in order to then radiate an additional multidimensional, spatially-selective RF excitation pulse using said calculated phase correction and said calculated time correction in order to correct the phase errors of the next multidimensional, spatially-selective radio-frequency excitation pulse that is emitted in further execution of the MR data acquisition sequence.

2. A method as claimed in claim 1,
wherein said multidimensional, spatially-selective RF excitation pulse and said predetermined region of the subject are defined in a patient coordinate system, and wherein said MR data acquisition unit has an MR coordinate system associated therewith, and comprising:

in said processor, implementing a coordinate transformation from said patient coordinate system into said MR coordinate system; and after the coordinate transform is implemented operating said MR data acquisition unit in order to radiate said additional multidimensional, spatially-selective RF excitation pulse along a defined axis of said MR coordinate system obtained from said implemented coordinate transformation.

3. A method as claimed in claim 2 comprising:
operating said MR data acquisition unit with an imaging echo sequence that uses acquisition gradient fields in order to acquire MR data from the acquisition gradient echoes, with said acquired MR data representing an image of said predetermined region of the subject and with said acquisition gradient fields being defined in said patient coordinate system.

4. A method as claimed in claim 3 comprising correcting phase errors in said acquired MR data by mathematically removing said calculated phase response and said calculated phase shift therefrom with said processor.

5. A method as claimed in claim 3 comprising:
acquiring a plurality of additional calibration gradient echoes of the excited transverse magnetization with the MR data acquisition unit by using a plurality of additionally associated positive and negative calibration gradient fields,
along with said additional calibration gradient echoes, and thereby respectively providing additional calibration data of respective k-space lines, as part of the MR data acquisition sequence;
in said processor, automatically determining an additional calculated phase response of all the additional calibration data;
in said processor, automatically determining an additional calculated phase shift of all the additional calibration data;
in said processor, automatically calculating an additional phase correction that counteracts said additional calculated phase shift;
in said processor, automatically calculating an additional time correction that counteracts said additional calculated phase response;
and correcting said acquired MR data by mathematically removing the additional calculated phase response and the additional calculated phase shift from the acquired MR data.

6. A method as claimed in claim 5 comprising setting with said processor, at least one of an amplitude and a duration of said additional calibration gradient fields, of the MR data acquisition sequence to be equal to an amplitude or a duration of said acquisition gradient fields.

7. A method as claimed in claim 2 comprising implementing an acquisition of said plurality of gradient echoes with the MR data acquisition unit, in said computerized processor, and from the acquired gradient echoes:
determining said phase response,
determining said phase shift,
calculating said phase correction, and
calculating said time correction, all along a respective axis of the patient coordinate system over which the multidimensional, spatially-selective excitation pulse is defined,
providing said determinations and calculations as an output of the computerized processor; and
wherein said respective k-space lines onto to which the calibration gradient echo data entered are oriented along at least one axis of said MR coordinate system.

8. A method as claimed in claim 7 comprising with the computerized processor:
individually calculating both of said phase correction and said time correction along each respective axis of the patient coordinate system, and
radiating with the MR data acquisition unit said additional multidimensional, spatially-selective RF excitation pulse based on the calculated individual phase corrections and the calculated individual time corrections along each respective axis of the patient coordinate system.

9. A method as claimed in claim 2 comprising implementing with the MR data acquisition unit, the acquiring of said plurality of calibration gradient echoes, and then with the computerized processor:
determining said phase response,
determining said phase shift,
calculating said phase correction, and
calculating said time correction, respectively along each of three orthogonal axis of the MR coordinate system of the MR data acquisition unit, and
providing said determinations and calculations as an output of the computerized processor;
wherein said respective k-space lines onto to which the calibration gradient echo data entered are oriented along an axis of said MR coordinate system.

10. A method as claimed in claim 9 comprising:
with the computerized processor calculating said phase correction and calculating said time correction individually for each of three orthogonal axes of said MR coordinate system, system provided by the MR data acquisition unit; and
with the MR data acquisition unit, radiating said additional multidimensional, spatially-selective RF excitation pulse correction that implements the calculated individual phase corrections and the calculated individual time corrections that have been calculated by the computerized processor for each of said three orthogonal axes of said MR coordinate system provided by the MR data acquisition unit.

11. A method as claimed in claim 1 comprising setting with said processor, at least one of an amplitude and a duration of said additional calibration gradient fields of the MR data acquisition sequence, to be equal to an amplitude or a duration of said acquisition gradient fields.

12. A method as claimed in claim 1 comprising:
acquiring with the MR data acquisition unit, three calibration gradient echoes using two positive calibration gradient fields and one negative calibration gradient field, and
averaging with said processor, the two calibration gradient echoes acquired with the positive calibration gradient echo fields, and
applying said averaging in order to correct the phase errors of the multidimensional, spatially-selective radio-frequency excitation pulse in the MR data acquisition sequence.

13. A magnetic resonance (MR) apparatus configured to correct phase errors in a multidimensional, spatially-selective radio-frequency excitation pulse in an MR data acquisition sequence, comprising:
an MR data acquisition unit;
a control unit configured to operate said MR data acquisition unit by radiating a multidimensional, spatially-selective radio-frequency (RF) excitation pulse, into a subject located in the MR data acquisition unit, with associated excitation gradient fields of the multidimensional, spatially-selective RF excitation pulse configured to excite transverse magnetization of nuclear spins in a predetermined region of the subject;

said control unit also being configured to operate the MR data acquisition unit in order to detect a plurality of calibration gradient echoes using associated positive and negative calibration gradient fields;

said control unit being further configured to enter said detected calibration gradient echoes into an electronic memory with respective lines of k-space in said memory, being entered as calibration data;

a computerized processor supplied with said entered calibration data, said computerized processor being configured to automatically calculate a phase response of the calibration data;

said processor also being configured to automatically calculate a phase shift of the detected and entered calibration data;

said processor additionally being configured to automatically calculate a phase correction of the multidimensional, spatially-selective RF excitation pulse that counteracts said calculated phase shift;

said processor further being configured to automatically calculate a time correction of the multidimensional, spatially-selective RF excitation pulse that counteracts said calculated phase response; and said control unit being configured to operate said MR data acquisition unit in order to radiate an additional multidimensional, spatially-selective RF excitation pulse using said calculated phase correction and said calculated time correction and thereby correct the phase errors of the next multidimensional, spatially-selective radio-frequency excitation pulse that is emitted in further execution of the MR data acquisition sequence.

* * * * *